United States Patent
Sridharan et al.

(10) Patent No.: US 10,340,684 B2
(45) Date of Patent: Jul. 2, 2019

(54) VOLTAGE DERIVATIVE AND ZERO-SEQUENCE BROKEN CONDUCTOR DETECTION

(71) Applicant: Schweitzer Engineering Laboratories, Inc., Pullman, WA (US)

(72) Inventors: Balasubramanian Sridharan, Pullman, WA (US); Kamal Garg, Pullman, WA (US); Dennis Haes, Colfax, WA (US); Hong Chun, San Jose, CA (US)

(73) Assignee: Schweitzer Engineering Laboratiories, Inc., Pullman, WA (US)

( * ) Notice: Subject to any disclaimer, the term of this patent is extended or adjusted under 35 U.S.C. 154(b) by 451 days.

(21) Appl. No.: 15/097,036

(22) Filed: Apr. 12, 2016

(65) Prior Publication Data

US 2016/0308349 A1    Oct. 20, 2016

Related U.S. Application Data

(60) Provisional application No. 62/149,388, filed on Apr. 17, 2015.

(51) Int. Cl.
  *H02H 5/10*    (2006.01)
  *H02H 7/26*    (2006.01)
  (Continued)

(52) U.S. Cl.
  CPC ............. *H02H 7/26* (2013.01); *G01R 19/12* (2013.01); *G01R 31/083* (2013.01); *G01R 31/085* (2013.01); *H02H 5/10* (2013.01)

(58) Field of Classification Search
  CPC ... H02H 5/10; H02H 7/26; G01R 31/085–086
  See application file for complete search history.

(56) References Cited

U.S. PATENT DOCUMENTS 4,297,740 A * 10/1981 Hagberg ................ H02H 3/387
  361/67
4,600,961 A * 7/1986 Bishop ................... H02H 3/343
  361/76

(Continued)

FOREIGN PATENT DOCUMENTS

WO    2014/018909    1/2014

*Primary Examiner* — Ronald W Leja
*Assistant Examiner* — Christopher J Clark
(74) *Attorney, Agent, or Firm* — Justin K. Flanagan; Richard M. Edge

(57) ABSTRACT

A location of a broken electrical conductor of an electric power delivery system may be detected by monitoring a rate of change of phase voltage and/or a rate of change of zero-sequence voltage at various points on the conductor. Intelligent electronic devices (IEDs) such as phasor measurement units may be used to obtain measurements and calculate synchrophasors. The synchrophasors may be used by a central controller to determine which two continuous IEDs measure rates of change of voltages of opposite polarities, where the broken conductor is between the two continuous IEDs. The synchrophasors may be used by a central controller to determine which two continuous IEDs where one exhibits a zero-sequence voltage magnitude that exceeds a predetermined threshold for a predetermined time, wherein the zero-sequence voltage magnitude of the other of the continuous IEDs does not exceed the predetermined threshold.

18 Claims, 10 Drawing Sheets

(51) Int. Cl.
*G01R 31/08* (2006.01)
*G01R 19/12* (2006.01)

(56) References Cited

U.S. PATENT DOCUMENTS

| | | | |
|---|---|---|---|
| 5,883,578 A | 3/1999 | Roberts | |
| 6,573,726 B1* | 6/2003 | Roberts | H02H 3/081 |
| | | | 324/509 |
| 6,833,711 B1 | 12/2004 | Hou | |
| 7,720,619 B2 | 5/2010 | Hou | |
| 7,945,400 B2 | 5/2011 | Hou | |
| 9,160,158 B2* | 10/2015 | Schweitzer, III | H02H 3/08 |
| 9,413,156 B2 | 8/2016 | O'Brien | |
| 9,568,516 B2* | 2/2017 | Gubba Ravikumar | |
| | | | G01R 21/00 |
| 2005/0057212 A1* | 3/2005 | Harbaugh | H02P 21/22 |
| | | | 318/809 |
| 2005/0231871 A1* | 10/2005 | Karimi Ghartemani | |
| | | | G01R 19/2513 |
| | | | 361/86 |
| 2007/0055889 A1* | 3/2007 | Henneberry | G01R 19/2513 |
| | | | 713/186 |
| 2008/0211511 A1* | 9/2008 | Choi | G01R 31/086 |
| | | | 324/522 |
| 2011/0075304 A1* | 3/2011 | Hamer | H02H 7/263 |
| | | | 361/47 |
| 2012/0068717 A1* | 3/2012 | Gong | G01R 31/085 |
| | | | 324/522 |
| 2012/0330582 A1* | 12/2012 | Wiszniewski | H02H 3/307 |
| | | | 702/58 |
| 2013/0107405 A1* | 5/2013 | Blumschein | G01R 31/025 |
| | | | 361/79 |
| 2014/0028116 A1* | 1/2014 | O'Brien | H02H 3/02 |
| | | | 307/130 |
| 2015/0124358 A1* | 5/2015 | Hulse | H02H 3/325 |
| | | | 361/47 |
| 2016/0041216 A1* | 2/2016 | Tang | H02H 3/38 |
| | | | 324/509 |
| 2016/0091537 A1* | 3/2016 | Gaarder | G06Q 10/00 |
| | | | 324/764.01 |
| 2016/0266193 A1* | 9/2016 | Ennis | G01R 31/086 |
| 2016/0299187 A1* | 10/2016 | Liang | H02H 1/0092 |

\* cited by examiner

VOLTAGE DERIVATIVE AND ZERO-SEQUENCE BROKEN CONDUCTOR DETECTION

RELATED APPLICATION

The present application claims priority under 35 U.S.C. § 119(e) to U.S. Provisional Patent Application No. 62/149,388, filed Apr. 17, 2015, and titled "VOLTAGE DERIVATIVE AND ZERO-SEQUENCE BROKEN CONDUCTOR DETECTION," which is incorporated herein by reference in its entirety.

TECHNICAL FIELD

This disclosure relates to detection of broken conductors on electric power delivery systems. More particularly, this disclosure relates to detection of a broken conductor in an electric power delivery system using a rate of change of voltage or zero-sequence voltage magnitude.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
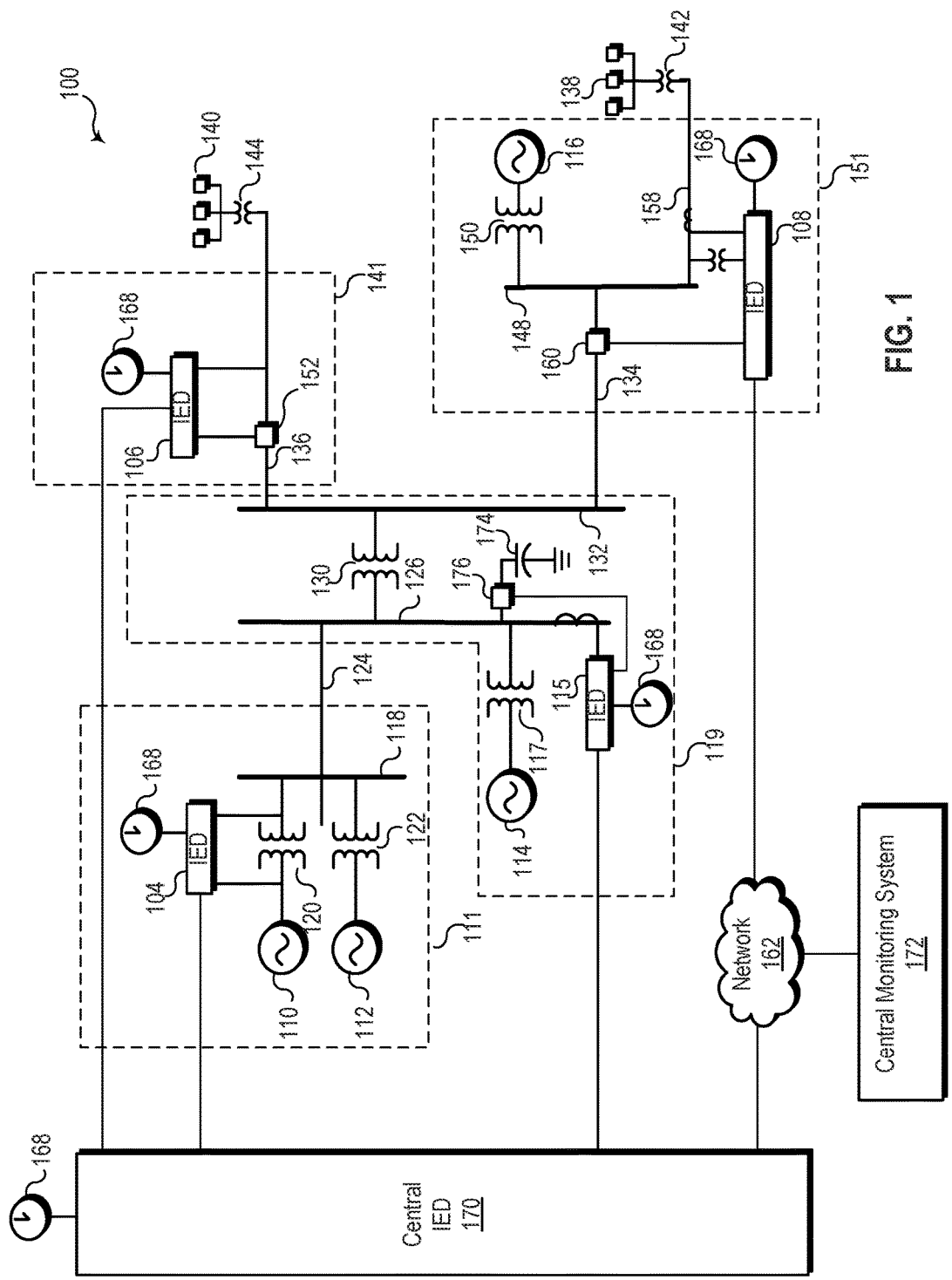
FIG. 1 illustrates an example of an embodiment of a simplified one-line diagram of an electric power transmission and distribution system in which a broken conductor event may occur consistent with embodiments of the present disclosure.

Electric power delivery systems are used worldwide to deliver electric power to end users in a safe, reliable, and economic manner. Because large amounts of power can be transmitted long distances at speeds approaching the speed of light, electric power is a preferred method of power delivery for many applications. Incredible infrastructure has been developed and maintained to the end of electric power delivery. Such infrastructure includes conductors capable of delivering high power at a wide range of voltages. Electric power delivery conductors may be situated underground, underwater, through utility access ways, overhead, and the like. Overhead conductors may not include an integrated insulator, such as a rubber or plastic sleeve, but may instead be insulated from the ground by surrounding air.

Conductors used for electric power delivery may pose a danger to anyone who comes into contact with the conductor while energized. Thus, conductors are typically placed out of the way from people. However, a broken conductor may pose a risk by falling from an overhead position, or energizing other conductive material near the broken conductor. For example, a conductor for a high-voltage transmission line may be situated as an overhead conductor, strung between towers. The conductor may incur stresses such as mechanical and thermal stresses, which may be increased during periods of elevated current, weather conditions, or other factors, further increasing the thermal and/or mechanical stresses. The overhead conductor may break and fall, posing a threat unless it is de-energized.

A system that monitors a rate of change of voltage or a rate of change of zero-sequence voltage at various points on the conductor and act to decrease the likelihood that the conductor will contact the ground, other infrastructure, or a person while still energized. That is, the system may de-energize the conductor before it comes in contact ground, other infrastructure, or a people. Such a system may automatically locate a break in a conductor and disconnect that portion of the conductor. One embodiment of a system may include circuit breakers (e.g., reclosers), intelligent electronic devices (IEDs), and a central controller device.

In some embodiments, the IEDs may be configured to obtain electrical measurements from the conductor. The IEDs may also determine phasor data from the measurements and transmit the phasor data. For example, the IED may be a phasor measurement unit that is placed along the conductor to obtain phasor data then transmit the phasor data to a central controller device or to a phasor data concentrator configured to align the phasor data.

The central IED, according to some embodiments, may be configured to receive the phasor data from the plurality of IEDs and detect a broken conductor condition based on the phasor data. The central controller device may detect the broken conductor condition by comparing a rate of change of voltage from the phasor data of each of the plurality of IEDs. In some embodiments, the central controller device may also determine a location of a broken conductor by comparing the rate of change of voltage of neighboring IEDs. For example, the location of the broken conductor may be determined to be where the rate of change of voltage of neighboring IEDs reaches a predetermined threshold such as when the rate of change of voltage from the neighboring IEDs has opposite polarities.

In another embodiment, the central controller device may use the rate of change of zero-sequence voltage to detect or verify the location of a broken conductor. For example, if the broken conductor has already been detected using the rate of change of voltage, the central controller device may verify the location of the broken conductor if a rate of change of zero-sequence voltage on one of the neighboring IEDs exceeds a predetermined threshold for a predetermined time and the rate of change of zero-sequence voltage on another of the neighboring IEDs does not exceed the predetermined threshold. In another embodiment, the central controller device may detect the broken conductor condition by comparing a zero-sequence voltage magnitude from the phasor data of each of the plurality of IEDs.

In some embodiments, the central controller device may send a command that causes the circuit breakers to disconnect a section of the conductor where the location of the broken conductor is determined to be. The command may directly open the circuit breakers, or the command may go to the IEDs that control the circuit breakers. The circuit breakers may be part of or controlled by the IEDs.

In many instances throughout this disclosure and in the claims, the term circuit breaker is used contextually to broadly encompass a wide range of suitable circuit breakers for a particular application, including potentially, electronically operated circuit breakers, manually operated circuit breakers, reclosers, autoreclosers, low-voltage circuit breakers, thermal-magnetic circuit breakers, magnetic circuit breakers, electronically-actuated circuit breakers, $SF_6$ circuit breakers, $CO_2$ circuit breakers, and/or other circuit breaker types.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need to be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that perform one or more tasks or implement particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

FIG. 1 illustrates an example of an embodiment of a simplified one-line diagram of an electric power transmission and distribution system 100 in which a broken conductor event may occur consistent with embodiments of the present disclosure. The electric power delivery system 100 may be configured to generate, transmit, and distribute electric energy to loads. Electric power delivery systems may include equipment, such as electric generators (e.g., generators 110, 112, 114, and 116), power transformers (e.g., transformers 117, 120, 122, 130, 142, 144, and 150), power transmission and delivery lines (e.g., lines 124, 134, and 158), circuit breakers (e.g., breakers 152, 160, and 176), busses (e.g., busses 118, 126, 132, and 148), loads (e.g., loads 140 and 138), capacitors 174 and the like. A variety of other types of equipment may also be included in the electric power delivery system 100, such as voltage regulators, capacitor banks, and a variety of other types of equipment. Various substations 111, 119, 141, and 151 may be interconnected via transmission or delivery lines.

A substation 119 may include a generator 114, which may be a distributed generator, and which may be connected to bus a 126 through a step-up transformer 117. The bus 126 may be connected to a distribution bus 132 via a step-down transformer 130. Various distribution lines 136 and 134 may be connected to the distribution bus 132. The distribution line 136 may lead to a substation 141 where the line is monitored and/or controlled using an IED 106, which may selectively open and close a circuit breaker 152. A load 140 may be fed from the distribution line 136. A further step-down transformer 144 in communication with the distribution bus 132 via the distribution line 136 may be used to step down a voltage for consumption by the load 140.

The distribution line 134 may lead to a substation 151 and deliver electric power to a bus 148. The bus 148 may also receive electric power from a distributed generator 116 via a transformer 150. A distribution line 158 may deliver electric power from the bus 148 to a load 138 and may include a further step-down transformer 142. A circuit breaker 160 may be used to selectively connect the bus 148 to the distribution line 134. An IED 108 may be used to monitor and/or control the circuit breaker 160 as well as the distribution line 158.

The electric power delivery system 100 may be monitored, controlled, automated, and/or protected using intelligent electronic devices (IEDs), such as IEDs 104, 106, 108, 115, and 170, and a central monitoring system 172. In general, IEDs in an electric power generation and transmission system may be used for protection, control, automation, and/or monitoring of equipment in the system. For example, IEDs may be used to monitor equipment of many types, including electric transmission lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment.

As used herein, an IED (such as IEDs 104, 106, 108, 115, and 170) may refer to any microprocessor-based device that monitors, controls, automates, and/or protects monitored equipment within the electric power delivery system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

A common time signal may be distributed throughout the electric power delivery system 100. Utilizing a common or universal time source may ensure that IEDs have a synchronized time signal that can be used to generate time synchronized data, such as synchrophasors. In various embodiments, IEDs 104, 106, 108, 115, and 170 may receive a common time signal 168. The common time signal 168 may be distributed in the electric power delivery system 100 using a wide-area communications network 162 or using a common time source, such as a Global Navigation Satellite System (GNSS), or the like.

According to various embodiments, the central monitoring system 172 may comprise one or more of a variety of types of systems. For example, the central monitoring system 172 may include a supervisory control and data acquisition (SCADA) system and/or a wide-area control and situational awareness (WACSA) system. A central IED 170 may be in communication with IEDs 104, 106, 108, and 115. IEDs 104, 106, 108 and 115 may be remote from the central IED 170, and may communicate over various media such as a direct communication from IED 106 or over the communications network 162. According to various embodiments, certain IEDs may be in direct communication with other IEDs (e.g., the IED 104 is in direct communication with the central IED 170) or may be in communication via the communication network 162 (e.g., the IED 108 is in communication with the central IED 170 via the communication network 162).

Communication via the communication network 162 may be facilitated by networking devices including, but not limited to, radios, multiplexers, routers, hubs, gateways, firewalls, and switches. In some embodiments, IEDs and network devices may comprise physically distinct devices. In other embodiments, IEDs and network devices may be composite devices, or may be configured in a variety of ways to perform overlapping functions. IEDs and network devices may comprise multi-function hardware (e.g., processors, computer-readable storage media, communications interfaces, etc.) that can be utilized in order to perform a variety of tasks that pertain to network communications and/or to operation of equipment within the electric power delivery system 100.

Conductors in the electric power delivery system 100 may experience a broken conductor condition due to any number of factors such as mechanical stresses, thermal stresses, high-current conditions, weather conditions, earthquake, objects falling on the conductors, or the like. Conductors that may experience such conditions may be any of the transmission or distribution conductors. Indeed, the load 140 may be a residential neighborhood with overhead distribution conductors that may break, posing a threat to people. Furthermore, transmission conductors such as a line 124 may experience a break, posing a threat. Detection of such broken conductor conditions according to the embodiments disclosed herein and rapid de-energization of the broken conductor decrease the threat.

As discussed in greater detail below, systems and methods consistent with the present disclosure may be configured to identify such an event and may implement control strategies configured to avoid or minimize the severity of the event. For example, in certain embodiments, after detecting a broken conductor event, power may be disconnected from the broken conductor.

Figure 2A:
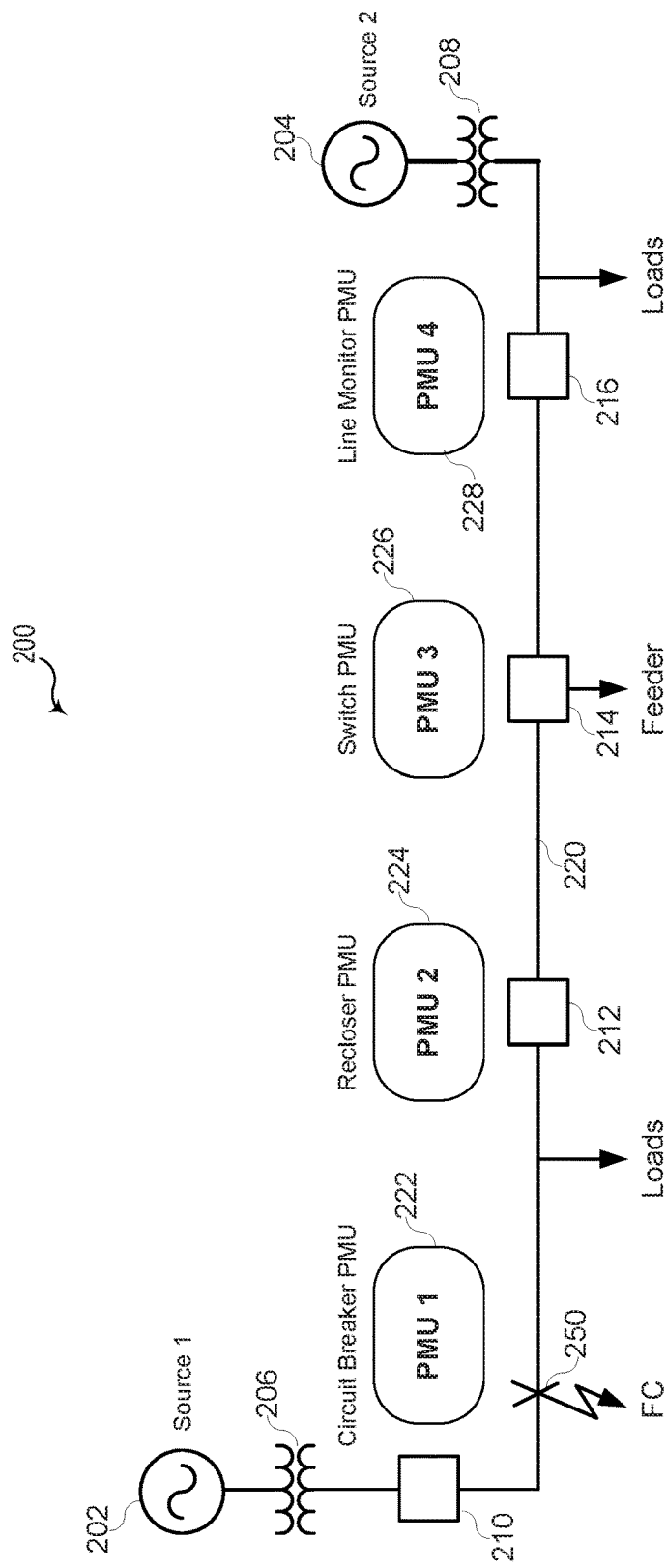
FIG. 2A illustrates a simplified one-line diagram of a system for detecting a broken conductor according to several embodiments herein.

FIG. 2A illustrates a simplified one-line diagram of a system 200 to detect and de-energize a broken conductor according to several embodiments herein. The system 200 includes two sources 202 and 204 which may be generators or other sources of electric power for providing electric power to loads. Transformers 206 and 208 transform the electric power from sources 202 and 204 to voltages required for delivery to loads. A conductor 220 electrically connects sources 1 and 2 (202, 204) through transformers 206 and 208 and may include various sections, and may be selectively opened or closed at various locations using circuit breakers 210, 212, 214, and 216. The conductor 220 may be situated as an overhead, or other. The system 200 is monitored by a number of IEDs such as PMU 1 222, PMU 2 224, PMU 3 226, and PMU 4 228. Each of the PMUs may be in communication with a portion of the conductor 220, and with respective circuit breakers 210-216.

The conductor 220 may experience a broken conductor condition 250 between PMUs 222 and 224. PMUs 222 and 224 and optionally another IED such as a synchrophasor vector processor/central IED 170. PMUs 222-228 may be configured to obtain measurements from the conductor 220 such as voltage and/or current measurements. PMUs 222-228 may be configured to calculate phasors from the voltage and/or current measurements, and possibly synchronized phasors such as synchrophasors using a common time source. The measurements, phasors, and/or synchrophasors may be used to detect the location of the break 250 in the conductor 220.

In one embodiment, a rate of change of voltage is used to detect the broken conductor condition and the location thereof. The rate of change of per phase voltage with respect to time (dV/dt) is used to detect broken conductor faults in electric power delivery system circuits. For a broken conductor event in a given phase, occurring between two PMU locations, the dV/dt behavior observed at the two PMUs is such that they are in opposite polarity. The absolute magnitude of dV/dt for the PMU further away from the power source rises steeply. When the dV/dt value rises above the threshold value, a supervision element may be used. For example, a rate of change of a zero-sequence voltage or $dV_0/dt$ may be used as supervision. Once the $dV_0/dt$ magnitude exceeds the threshold, the supervision check confirms the observance of a falling conductor and issues a trip command to the breakers associated with the PMUs. This embodiment works on each phase independently.

In another embodiment, a zero-sequence voltage magnitude $V_0$ may be used to detect a broken conductor condition and a location thereof. The zero-sequence voltage magnitude ($V_0$ magnitude) is used to detect broken conductor events in distribution circuits. For a broken conductor event in a given phase, occurring between two PMU locations, the PMU farther away from the source has a steep increase in the $V_0$ magnitude compared to the PMU closer to the source. When the $V_0$ magnitude rises above the threshold value and persists for a given time duration, the observance of a broken conductor event is confirmed and a trip command may be issued to the breakers associated with the PMUs.

Figure 2B:
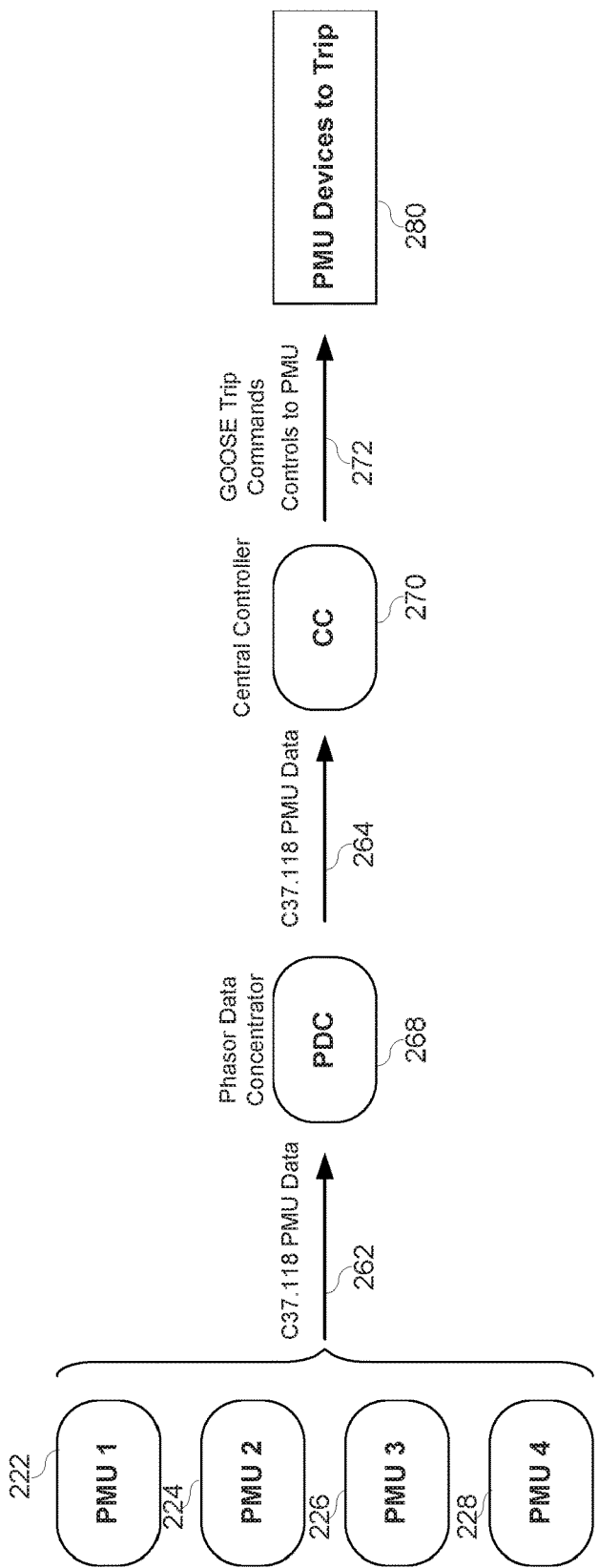
FIG. 2B illustrates a process for detecting a broken conductor according to several embodiments herein.

FIG. 2B illustrates a process for detecting a broken conductor according to several embodiments herein. As shown, PMUs 222-228 may collect electrical phasor data and send 262 that data to a phasor data concentrator 268. The phasor data concentrator 268 may align all the phasor data and send 264 that data to a central controller 270 (e.g., a central IED). The central controller 270 may analyze the PMU data and if it detects a broken conductor send a signal 272 to the PMU devices around the broken conductor to trip 280.

IEDs (e.g., PMUs 222-228 and the central controller 270) may communicate with other IEDs, monitored equipment, and/or network devices using one or more suitable communication protocols and/or standards. In certain embodiments one or more IEDs included in an electric power generation and delivery system may communicate using an IEC 61850 GOOSE (Generic Object Oriented Substation Events), SV (Sampled Values), MMS (Manufacturing Messaging Specification), SEL Fast Message (FM), Mirrored Bits®, and/or any other suitable protocol. GOOSE may be similarly utilized to facilitate communication between IEDs and GOOSE-enabled pieces of monitored equipment and/or network devices. For example, using GOOSE, IEDs, monitored equipment, and/or network devices may communicate messages (e.g., GOOSE messages) that include bits, bit pairs, measurement values, and/or any other relevant data elements. In certain circumstances, GOOSE may allow a message generated from a single device to be transmitted to multiple receiving devices (e.g., subscriber devices and/or particular receiving devices designated or identified in a GOOSE message).

Figure 3:
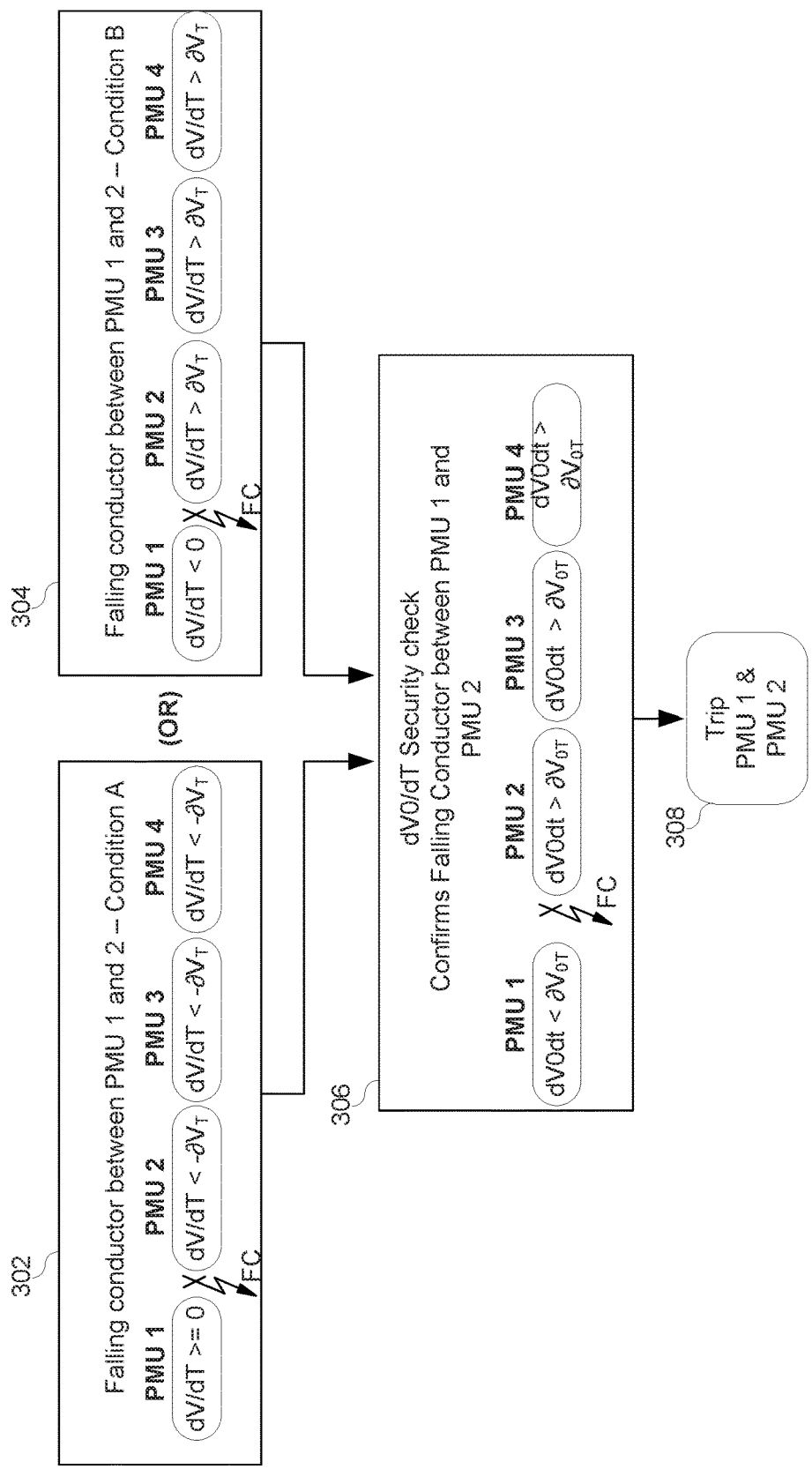
FIG. 3 illustrates a method for detecting a broken conductor between two phasor measurement units according to several embodiments herein.

FIG. 3 illustrates a block diagram of an embodiment of a method to detect a broken conductor as described herein with the broken conductor located between PMU 1 and PMU 2. According to one embodiment, PMUs 1, 2, 3, and 4 each obtain measurements from the power system, and calculate synchrophasor information therefrom. PMUs 1, 2, 3, and 4 may transmit the synchrophasor information to a central controller such as a synchrophasor vector processor or real time automation controller. According to some embodiments, PMUs 1, 2, 3, and 4 transmit synchrophasor information to a phasor data concentrator for time alignment, which then transmits the synchrophasor information to a central IED such as a synchrophasor vector processor, real time automation controller, or the like.

The central controller may then use the synchrophasor information to determine a rate of change of voltage, or dV/dt. In one embodiment, as illustrated in FIG. 3, Condition A 302, where the broken conductor is between PMUs 1 and 2, the dV/dt from PMU 1 will be greater than or equal to zero, where the dV/dt values from PMUs 2, 3, and 4 will be opposite in polarity to dV/dt of PMU 1. The central controller may, according to some embodiments, declare a broken conductor condition between PMUs 1 and 2, and instigate the PMUs to open circuit devices to isolate the broken conductor by, for example, opening circuit breakers 210 and 212. In some embodiments, the central controller may signal PMUs 1 and 2 to open circuit breakers 210 and 212. As illustrated in FIG. 3, Condition B 304, where the broken conductor is between PMUs 1 and 2, the dV/dt from PMU 1 will be less than or equal to zero, where the dV/dt values from PMUs 2, 3, and 4 will be opposite in polarity to dV/dt of PMU 1. The central controller may, according to some embodiments, declare a broken conductor condition between PMUs 1 and 2, and instigate the PMUs to open circuit breakers 308 to isolate the broken conductor by, for example, opening circuit breakers 210 and 212. In some embodiments, the central controller may signal PMUs 1 and 2 to open circuit breakers 210 and 212.

According to other embodiments, the central controller may supervise and confirm 306 the detection of the broken conductor by monitoring a rate of change of zero-sequence voltage or $dV_0/dt$. According to these embodiments, once the central controller detects the opposite polarities in dV/dt, the central controller may detect an increase in zero-sequence voltage ($V_0$) values from PMUs opposite of the broken conductor from the source. Thus, as can be seen in FIG. 3, $dV_0/dt$ values from PMUs 2, 3, and 4 exceed a predetermined threshold, whereas $dV_0/dt$ from PMU 1 does not exceed the predetermined threshold. Thus, the central controller may confirm 306 that the broken conductor is between PMUs 1 and 2, and instigate actions to open circuit breakers 308 associated with PMUs 1 and 2 to isolate the broken conductor from the sources.

As a related example, one or more IEDs may be configured to obtain electric measurements from an electric power delivery system from which phasors are calculated. The phasors may be based on the data obtained by each of the IEDs. The IEDs themselves, one of the IEDs, and/or a central processing IED may then compare the phasor data associated with a first IED to the phasor data associated with a different IED (e.g., a neighboring IED). A broken conductor condition may be identified when the phasor data is sufficiently different or exceeds threshold levels of difference in various aspects. The identification of a broken conductor may result in a command or a notification being transmitted or raised. For instance, the central IED may transmit a command to disconnect a section of the conductor proximate the location of the broken conductor.

Figure 4:
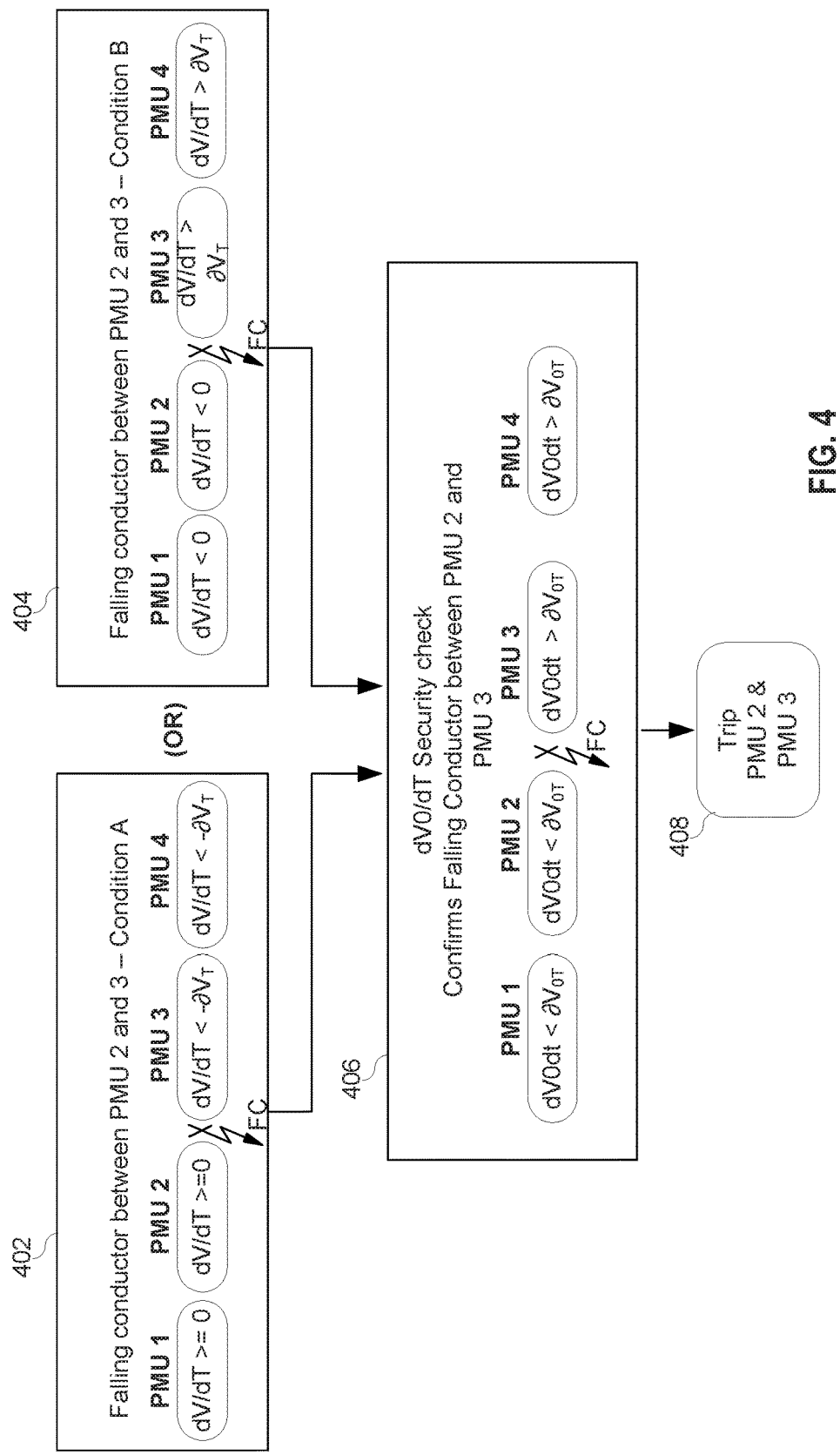
FIG. 4 illustrates a method for detecting a broken conductor between two phasor measurement units according to several embodiments herein.

FIG. 4 illustrates a block diagram of an embodiment of a method to detect a broken conductor as described herein with the broken conductor located between PMU 2 and PMU 3. According to one embodiment, PMUs 1, 2, 3, and 4 each obtain measurements from the power system, and calculate synchrophasor information therefrom. PMUs 1, 2, 3, and 4 may transmit the synchrophasor information to a central controller. According to some embodiments, PMUs 1, 2, 3, and 4 transmit synchrophasor information to a phasor data concentrator for time alignment, which then transmits the synchrophasor information to a central IED or central controller.

The central controller may then use the synchrophasor information to determine a rate of change of voltage, or dV/dt. In one embodiment, as illustrated in FIG. 4, Condition A 402, where the broken conductor is between PMUs 2 and 3, the dV/dt from PMUs 1 and 2 will be greater than or equal to zero, where the dV/dt values from PMUs 3 and 4 will be opposite in polarity to dV/dt of PMUs 1 and 2. The central controller may, according to some embodiments, declare a broken conductor condition between PMUs 2 and 3, and instigate the PMUs to open circuit devices to isolate the broken conductor by, for example, opening circuit breakers 212 and 214. Although the figures and several embodiments herein describe circuit breakers, any device capable of opening the conductor may be used, such as, for example, disconnects, switching devices, or the like. In some embodiments, the central controller may signal PMUs 2 and 3 to open circuit breakers 212 and 214. As illustrated in FIG. 4, Condition B 404, where the broken conductor is between PMUs 2 and 3, the dV/dt from PMUs 2 and 3 will be less than or equal to zero, where the dV/dt values from PMUs 3, and 4 will be opposite in polarity to dV/dt of PMUs 1 and 2. The central controller may, according to some embodiments, declare a broken conductor condition between PMUs 2 and 3, and instigate the PMUs to open circuit devices to isolate the broken conductor by, for example, opening circuit breakers 212 and 214. In some embodiments, the central controller may signal PMUs 2 and 3 to open circuit breakers 212 and 214.

According to other embodiments, the central controller may supervise and confirm 406 the detection of the broken conductor by monitoring a rate of change of zero-sequence voltage or $dV_0/dt$. According to these embodiments, once the central controller detects the opposite polarities in dV/dt, the central controller may detect an increase in zero-sequence voltage ($V_0$) values from PMUs opposite of the broken conductor from the source. Thus, as can be seen in FIG. 4, $dV_0/dt$ values from PMUs 3, and 4 exceed a predetermined threshold, whereas $dV_0/dt$ from PMUs 1 and 2 does not exceed the predetermined threshold. Thus, the central controller may confirm 406 that the broken conductor is between PMUs 2 and 3, and instigate actions to open circuit devices 408 associated with PMUs 2 and 3 to isolate the broken conductor from the sources.

Thus, a system may include any number of circuit breakers protecting any number of conductors. IEDs monitoring the circuit breakers and/or the conductor may be networked and/or all communicate with a central IED. Electrical measurement data gathered by the IEDs may be used to generate phasor information, such that each IED generates phasor data for a section of or location on a conductor. The phasor data from each of the measuring IEDs may be compared by the central IED and/or by neighboring IEDs to identify broken conductor anomalies or events. As described above, the broken conductor may be identified based on a difference in a rate of change of voltage from the phasor data between two or more IEDs.

Alternatively and/or additionally, a location of the broken conductor may be determined by comparing the rate of change of voltage of neighboring IEDs. Specifically, if the rate of change of voltage from one IEDs has an opposite polarity from that of a neighboring IED, then a broken conductor may be flagged.

Figure 5:
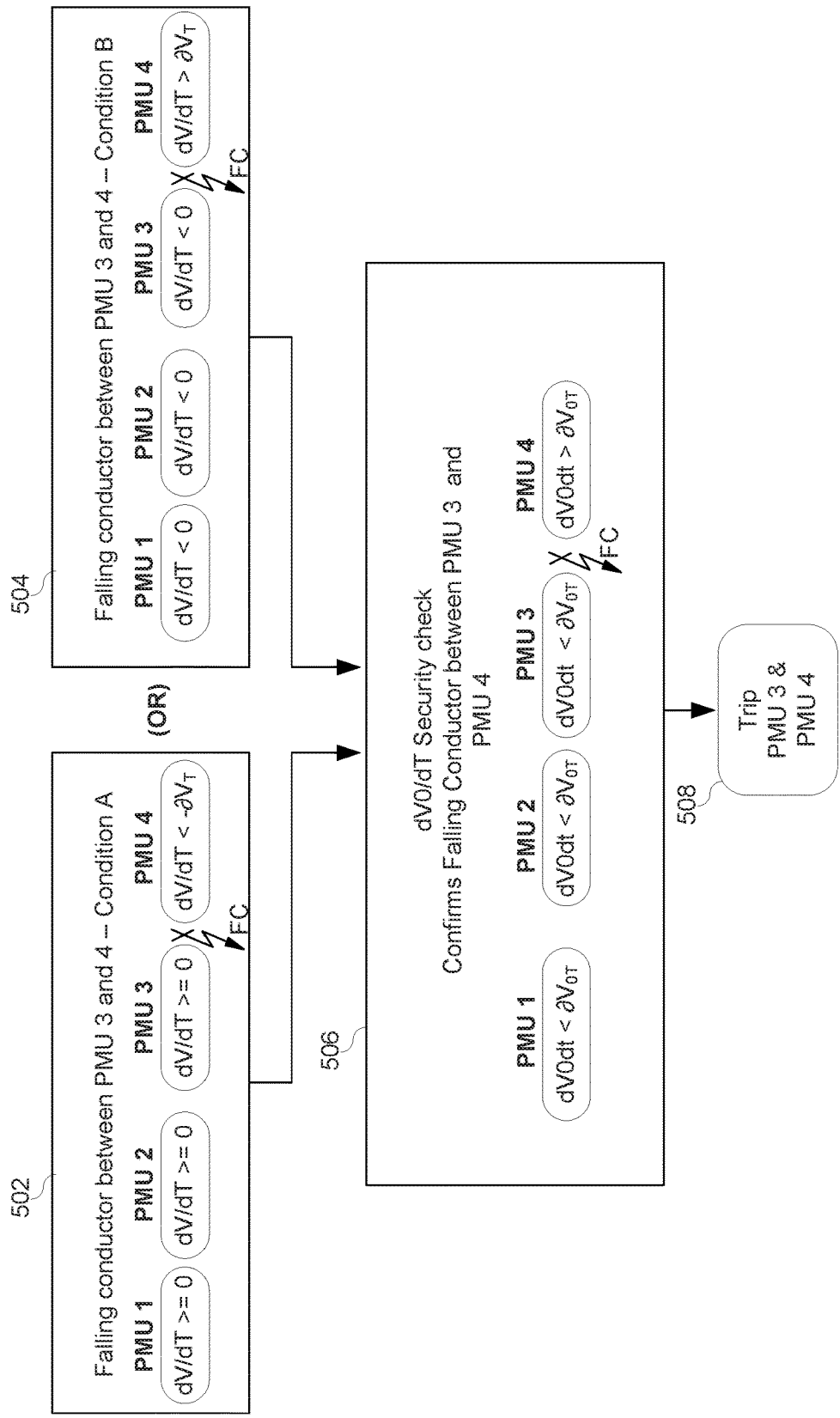
FIG. 5 illustrates a method for detecting a broken conductor between two phasor measurement units according to several embodiments herein.

FIG. 5 illustrates a block diagram of an embodiment of a method to detect a broken conductor as described herein with the broken conductor located between PMU 3 and PMU 4. According to one embodiment, PMUs 1, 2, 3, and 4 each obtain measurements from the power system, and calculate synchrophasor information therefrom. PMUs 1, 2, 3, and 4 may transmit the synchrophasor information to a central controller such as a synchrophasor vector processor or real time automation controller. According to some embodiments, PMUs 1, 2, 3, and 4 transmit synchrophasor information to a phasor data concentrator for time alignment, which then transmits the synchrophasor information to a central IED or central controller.

The central controller may then use the synchrophasor information to determine a rate of change of voltage, or dV/dt. In one embodiment, as illustrated in FIG. 5, Condition A 502, where the broken conductor is between PMUs 3 and 4, the dV/dt from PMUs 1, 2, and 3 will be greater than or equal to zero, where the dV/dt values from PMU 4 will be opposite in polarity to dV/dt of PMUs 1, 2, and 3. The central controller may, according to some embodiments, declare a broken conductor condition between PMUs 3 and 4, and instigate the PMUs to open circuit devices to isolate the broken conductor by, for example, opening circuit breakers 214 and 216. In some embodiments, the central controller may signal PMUs 3 and 4 to open circuit breakers 214 and 216. As illustrated in FIG. 5, Condition B 504, where the broken conductor is between PMUs 3 and 4, the dV/dt from PMUs 2 and 3 will be less than or equal to zero, where the dV/dt values from PMUs 3, and 4 will be opposite in polarity to dV/dt of PMUs 1 and 2. The central controller may, according to some embodiments, declare a broken conductor condition between PMUs 3 and 4, and instigate the PMUs to open circuit devices to isolate the broken conductor by, for example, opening circuit breakers 214 and 216. In some embodiments, the central controller may signal PMUs 3 and 4 to open circuit breakers 214 and 216.

According to other embodiments, the central controller may supervise and confirm 506 the detection of the broken conductor by monitoring a rate of change of zero-sequence voltage or $dV_0/dt$. According to these embodiments, once the central controller detects the opposite polarities in dV/dt, the central controller may detect an increase in zero-sequence voltage ($V_0$) values from PMUs opposite of the broken conductor from the source. Thus, as can be seen in FIG. 5, $dV_0/dt$ values from PMU 4 exceed a predetermined threshold, whereas $dV_0/dt$ from PMUs 1, 2, and 3 does not exceed the predetermined threshold. Thus, the central controller may confirm 506 that the broken conductor is between PMUs 3 and 4, and instigate actions to open circuit devices 508 associated with PMUs 3 and 4 to isolate the broken conductor from the sources.

According to several embodiments using the rate of change of voltage or dV/dt, the central controller may be configured to detect the particular phase experiencing the broken conductor. The central controller may then be configured to only open that particular phase.

According to several embodiments, the system may detect the broken conductor using the zero-sequence voltage magnitudes or $V_0$. According to these embodiments, the central controller may function similarly to the embodiments using the rate-of-change-of-voltage in that PMUs 222-228 each transmit synchrophasor information to the central IED, which may be a synchrophasor vector processor or real time automation controller. The central IED may be configured to detect which PMUs exhibit values of $V_0$ that exceed a predetermined threshold for a predetermined time. The broken conductor is then detected between the consecutive PMUs where one does exhibit $V_0$ that exceeds the predetermined threshold for a predetermined time, and the other does not.

Figure 6:
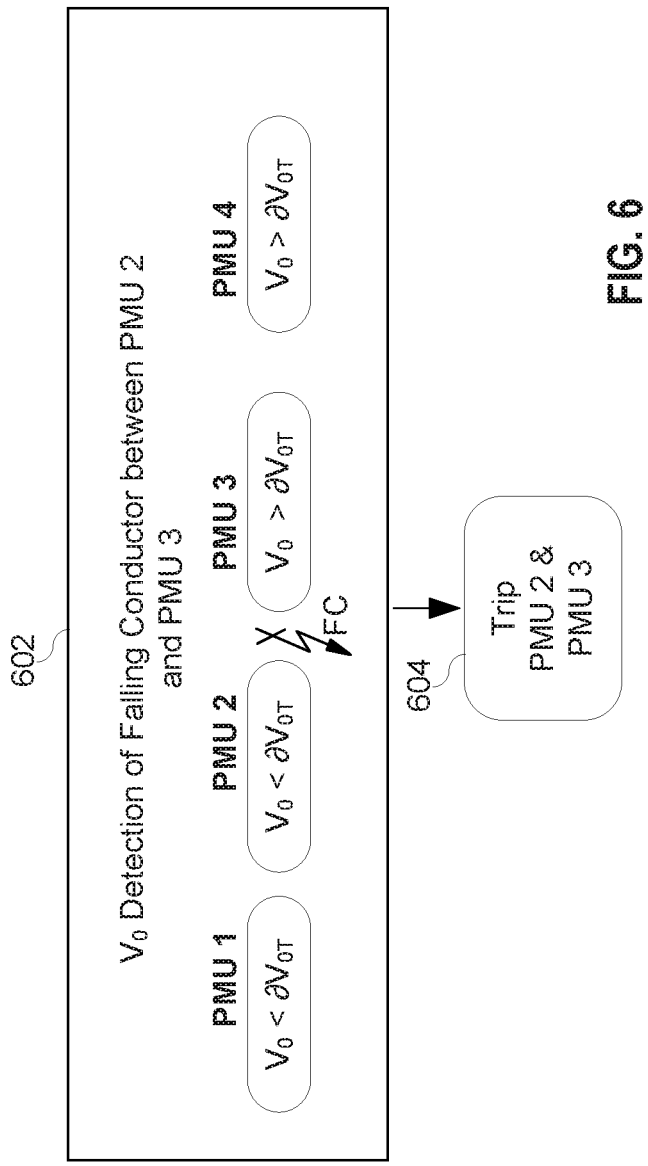
FIG. 6 illustrates a method for detecting a broken conductor between two phasor measurement units according to several embodiments herein.

FIG. 6 illustrates a block diagram of an embodiment of a method to detect a broken conductor as described herein with the broken conductor located between PMU 2 and PMU 3 using the zero-sequence voltage magnitude. According to one embodiment, PMUs 1, 2, 3, and 4 each obtain measurements from the power system, and calculate synchrophasor information therefrom. PMUs 1, 2, 3, and 4 may transmit the synchrophasor information to a central controller or a central processor. According to some embodiments, PMUs 1, 2, 3, and 4 transmit synchrophasor information to a phasor data concentrator for time alignment, which then transmits the synchrophasor information to the central IED or central processor.

The central controller may then use the synchrophasor information to determine zero-sequence voltages $V_0$ for each PMU. In one embodiment, as illustrated in FIG. 6, where the broken conductor is between PMUs 2 and 3, $V_O$ values from PMUs 1 and 2 will be less than a predetermined threshold. PMUs 1 and 2, it should be noted, are on the source side of the broken conductor. The $V_O$ values from PMUs 3 and 4, however, will exceed the predetermined threshold. Where the $V_O$ values from PMUs 3 and 4 exceed the predetermined threshold for a predetermined time, and the $V_O$ values from PMUs 1 and 2 do not exceed the predetermined threshold for the predetermined time, the central controller may determine 602 that the broken conductor is between PMUs 2 and 3, as PMUs 2 and 3 are two consecutive PMUs where one detects that $V_O$ exceeds the predetermined threshold for a predetermined time and the other does not. The central controller may then instigate commands 604 that disconnect the section of the conductor between PMUs 2 and 3.

Figure 7:
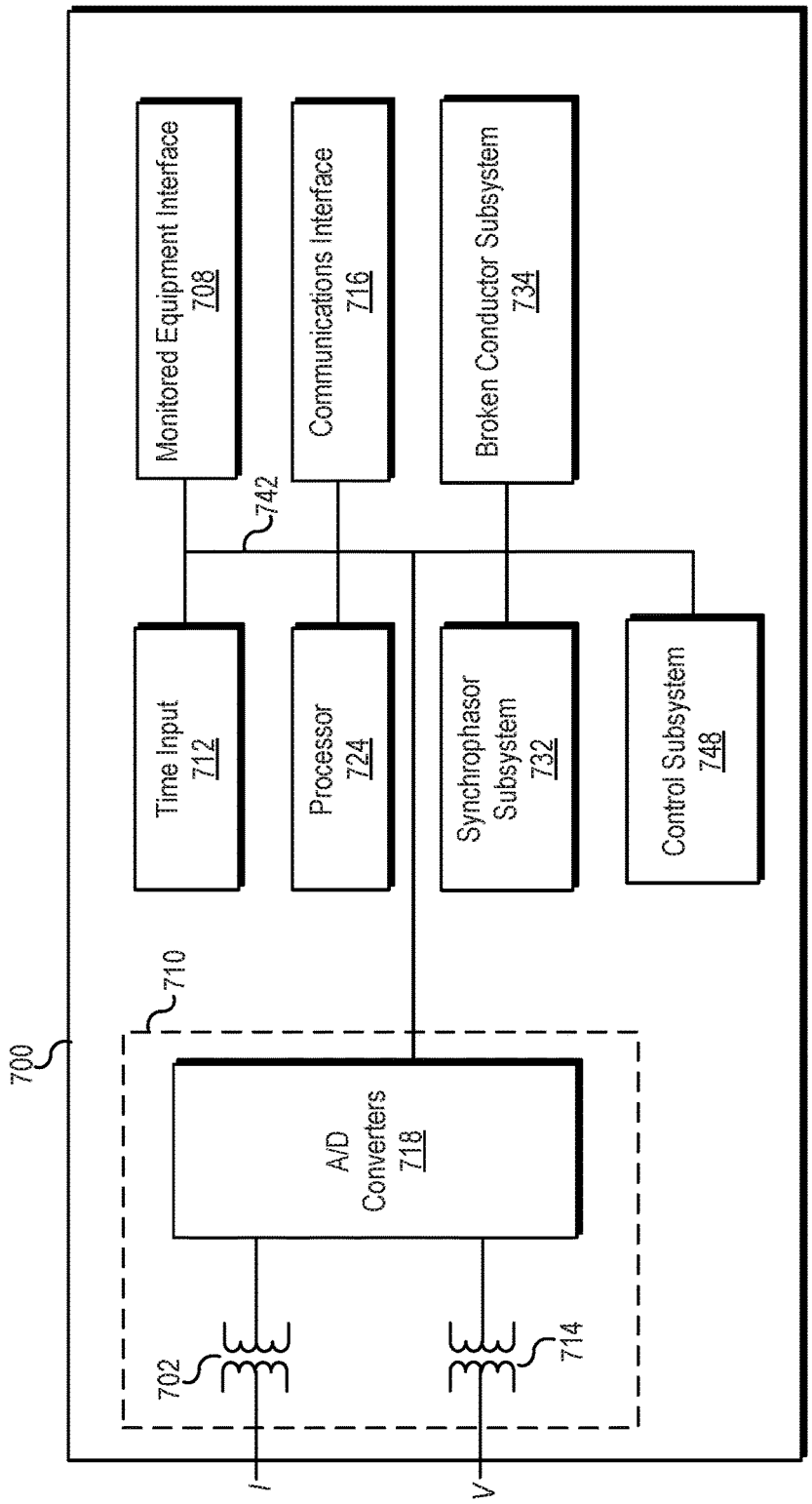
FIG. 7 illustrates a functional block diagram of a system configured to detect a broken conductor event and to implement a control strategy to avoid or reduce the severity of the broken conductor event consistent with embodiments of the present disclosure.

FIG. 7 illustrates a functional block diagram of a system 700 configured to detect a broken conductor event and to implement a control strategy to avoid or reduce the severity of the broken conductor event consistent with embodiments of the present disclosure. In certain embodiments, the system 700 may comprise an IED system configured, among other things, to detect a broken conductor event, and if so, to generate a control strategy to avoid or reduce the severity of the broken conductor event. The system 700 may be implemented in an IED using hardware, software, firmware, and/or any combination thereof. Moreover, certain components or functions described herein may be associated with other devices or performed by other devices. The specifically illustrated configuration is merely representative of one embodiment consistent with the present disclosure.

The system 700 includes a communications interface 716 configured to communicate with other IEDs, controllers, and/or devices associated with an electric power transmission and distribution system. In certain embodiments, the communications interface 716 may facilitate direct communication with another IED or communicate with another IED over a communications network. The communications interface 716 may facilitate communications with multiple devices. The system 700 may further include a time input 712, which may be used to receive a time signal (e.g., a common time reference) allowing the system 700 to apply a time-stamp to the acquired instructions or data points. A monitored equipment interface 708 may be configured to receive status information from, and issue control instructions to, a piece of monitored equipment (such as a circuit breaker, conductor, transformer, or the like).

A processor 724 may be configured to process communications received via the communications interface 716, time input 712, and/or monitored equipment interface 708 and to coordinate the operation of the other components of the system 700. The processor 724 may operate using any number of processing rates and architectures. The processor 724 may be configured to perform any of the various algorithms and calculations described herein. The processor 724 may be embodied as a general-purpose integrated circuit, an application-specific integrated circuit, a field-programmable gate array, and/or any other suitable programmable logic device.

In certain embodiments, the system 700 may include a sensor component 710. In the illustrated embodiment, the sensor component 710 is configured to gather data directly from equipment such as a conductor (not shown) and may use, for example, transformers 702 and 714 and A/D converters 718 that may sample and/or digitize filtered waveforms to form corresponding digitized current and voltage signals provided to a data bus 742. Current (I) and voltage (V) inputs may be secondary inputs from instrument transformers such as CTs and VTs. A/D converters 718 may include a single A/D converter or separate A/D converters for each incoming signal. A current signal may include separate current signals from each phase of a three-phase electric power system. A/D converters 718 may be connected to the processor 724 by way of the data bus 742, through which digitized representations of current and voltage signals may be transmitted to the processor 724. In various embodiments, the digitized current and voltage signals may be used to assess various electrical parameters relevant to the systems and methods disclosed herein. The data bus 742 may link the monitored equipment interface 708, the time input 712, the communications interface 716, and a plurality of additional subsystems.

A broken conductor subsystem 734 may be configured to detect a broken conductor according to the various embodiments described herein or to receive an indication of the occurrence of a broken conductor from a central controller. In some embodiments, the broken conductor subsystem 734 may be configured to operate in conjunction with the sensor component 710 to detect the occurrence of a power system event by monitoring the electrical characteristics associated with the current and voltage inputs. In other embodiments, an indication of a broken conductor may be communicated to the system 700 through the communications interface 716 and/or the monitored equipment interface 708. Still further, certain embodiments may be configured to both monitor the sensor component 710 and to receive an indication of a broken conductor event from either the monitored equipment interface 708 or the communications interface 716.

A synchrophasor subsystem 732 may be configured to determine phasor information from the voltages and/or currents, and format the phasor information into synchrophasors using a signal from the time input 712. In some embodiments, measurements used by the synchrophasor subsystem 732 may be obtained using the sensor component 710. In other embodiments, data regarding the event may be received via the monitored equipment interface 708 or the communications interface 716. Synchrophasor information from the synchrophasor subsystem 732 may be communicated to a controller such as a phasor data concentrator such as, for example, the central IED 170 of FIG. 1.

A control subsystem 748 may be configured to implement control actions configured to avoid or mitigate the broken conductor event. Such actions may include, for example, opening a circuit breaker, recloser, disconnect, or the like. In some embodiments, the control subsystem 748 may be configured to implement a plurality of control actions within a substation. In other embodiments, the control subsystem 748 may be configured to implement control actions that are coordinated across multiple substations. In some embodiments, communications regarding such control actions may be sent or received via the communications interface 716.

The central IED 170 of FIG. 1 may be a phasor data concentrator in communication with the various IEDs of the power system.

Figure 8:
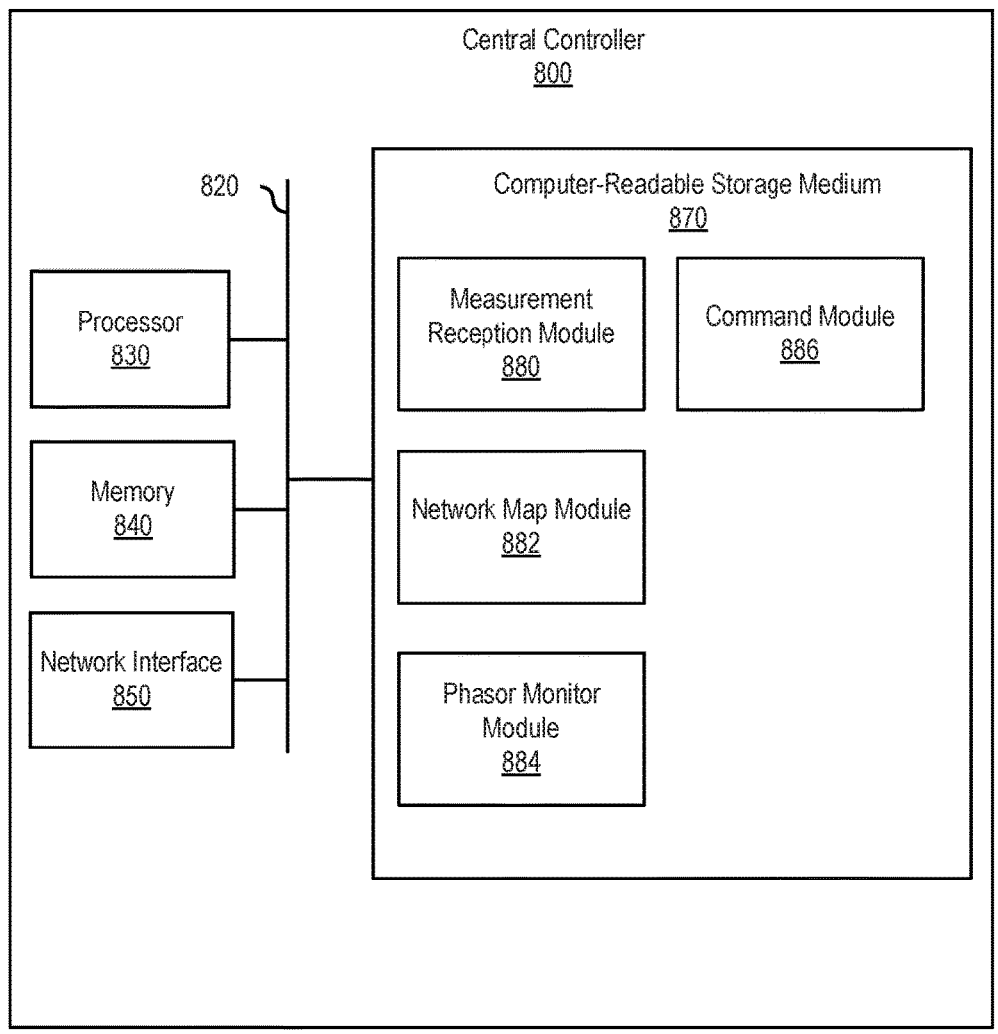
FIG. 8 illustrates a functional block diagram of one embodiment of a central controller computer system.

FIG. 8 is a functional block diagram of one embodiment of a central controller computer system. As illustrated, the central controller 800 may include a processor 830, a memory 840, and possibly a network 850 or other data transfer interface. A bus 820 may interconnect various integrated and/or discrete components. Various modules 870 may be implemented in hardware, software, firmware, and/or or a combination thereof.

A measurement reception module 880 may be configured to receive electric measurements from the electric power delivery system using IEDs in communication with the electric power delivery system. Further, a network map module 882 may associate each electrical measurement with the IED that obtained the measurement. This may allow the central controller 800 to determine which IEDs are neighboring.

A phasor monitor module 884 may be configured to compare the phasor data and detect a broken conductor. In some embodiments, the phasor monitor module 884 compares the phasor data associated with a first IED to the phasor data associated with a neighboring IED. A broken conductor is detected and located where the comparison of the phasor data reaches a certain predetermined threshold. For example, the predetermined threshold may occur when the rate of change of voltage of the first IED and the neighboring IED has opposite polarities. In another example, the predetermined threshold occurs when the first IED exceeds a predetermined threshold for a predetermined time and the rate of change of the zero-sequence voltage on the neighboring IED does not exceed the predetermined threshold. These methods may be used to verify each other. A command module 886 may be configured to send a command to disconnect a section of the conductor where the location of the broken conductor is determined to be.

Figure 9:
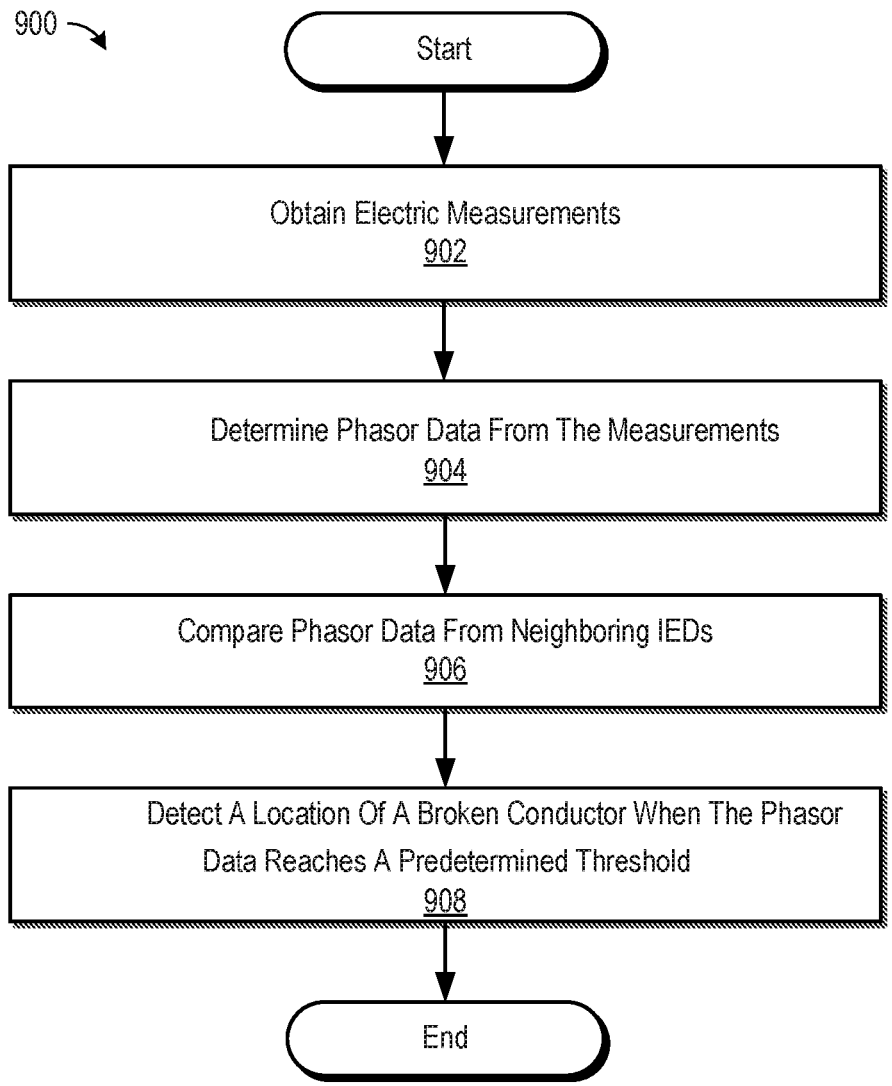
FIG. 9 is a flow chart of an example of a method for detecting a broken conductor on an electric power delivery system.

FIG. 9 is a flow chart 900 of an example of a method for detecting a broken conductor on an electric power delivery system. According to the method, electric measurements may be obtained 902 from the electric power delivery system using IEDs in communication with the electric power delivery system. Each electrical measurement may be associated with the IED that obtained the measurement. Phasor data may be determined 904 from the measurements. The phasor data associated with a first IED to the phasor data associated with a neighboring IED may be compared 906. This may allow the method to detect 908 a location of a broken conductor.

For example, the location may be determined to be where the comparison of the phasor data reaches a certain predetermined threshold. For instance, the phasor data may comprise a rate of change of voltage. An example predetermined threshold may be when the rate of change of voltage of the first IED and the neighboring IED has opposite polarities. In an alternate embodiment, the phasor data may comprise a rate of change of zero-sequence voltage. In such an embodiment, the predetermined threshold may occur when the first IED exceeds a predetermined threshold for a predetermined time and the rate of change of the zero-sequence voltage on the neighboring IED does not exceed the predetermined threshold.

Several embodiments described herein refer to detection of a broken conductor. According to several specific embodiments herein the broken conductor may be situated in an overhead section of the conductor where a break may result in a fall of the conductor or a portion thereof. The detection and de-energization of the broken conductor may be performed before the broken conductor contacts the ground, thus increasing safety of the electric power delivery system.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may not include long-distance transmission of high-voltage power. It should also be noted that although certain embodiments are described using PMUs, any IED capable of calculating and communicating synchrophasors as described herein may be used. Accordingly, many changes may be made to the details of the above-described embodiments without departing from the underlying principles of this disclosure. The scope of the present invention should, therefore, be determined only by the following claims.

What is claimed is:

1. A system for detecting a broken conductor, comprising:
   a plurality of circuit breakers in electrical communication with a conductor, wherein each circuit breaker is configured to open and close an electrical path of the conductor;
   a plurality of intelligent electronic devices in communication with the plurality of circuit breakers and the conductor, such that each circuit breaker is in communication with at least one intelligent electronic device, wherein each intelligent electronic device is configured to obtain electrical measurements from the conductor, determine phasor data from the measurements, and transmit the phasor data; and
   a central controller device in communication with the plurality of intelligent electronic devices configured to receive the phasor data from the plurality of intelligent electronic devices and use the received phasor data to detect a broken conductor condition of the conductor by comparing a rate of change of voltage from the phasor data of each of the plurality of intelligent electronic devices.

2. The system of claim 1, wherein the central controller device is configured to determine a location of a broken conductor by comparing the rate of change of voltage of neighboring intelligent electronic devices, such that the location of the broken conductor is determined based on a rate of change of voltage of neighboring intelligent electronic devices exceeding a predetermined threshold.

3. The system of claim 2, wherein the predetermined threshold is reached when the rates of change of voltage from neighboring intelligent electronic devices have opposite polarities.

4. The system of claim 2, wherein the central controller device is further configured to verify the location of the broken conductor when a rate of change of zero-sequence voltage on one of the neighboring intelligent electronic devices exceeds a predetermined threshold for a predetermined time and the rate of change of zero-sequence voltage on another of the neighboring intelligent electronic devices does not exceed the predetermined threshold.

5. The system of claim 2, wherein the central controller device is configured to send a command that causes at least one of the plurality of circuit breakers to disconnect a section of the conductor proximate the location of the broken conductor.

6. The system of claim 5, wherein the central controller device is configured to detect which of three phases in an electrical distribution system is experiencing the broken conductor and send a command to open only the phase detected to have the broken conductor.

7. The system of claim 1, wherein the central controller device is further configured to determine a location of a broken conductor by comparing a rate of change of the zero-sequence voltage on neighboring intelligent electronic devices, such that the location of the broken conductor corresponds to a location at which the rate of change of the zero-sequence voltage on one of the neighboring intelligent electronic devices exceeds a predetermined threshold for a predetermined time and the rate of change of the zero-sequence voltage on another of the neighboring intelligent electronic devices does not exceed the predetermined threshold.

8. The system of claim 1, wherein each of the intelligent electronic devices comprises a phasor measurement unit.

9. The system of claim 1, further comprising a phasor data concentrator configured to align the phasor data.

10. The system of claim 1, wherein at least one of the plurality of circuit breakers is a recloser circuit breaker.

11. A computer implemented method for detecting a broken conductor on an electric power delivery system, comprising:
    obtaining electric measurements from the electric power delivery system using intelligent electronic devices in communication with the electric power delivery system;
    determining phasor data from the measurements;
    comparing the phasor data associated with a first intelligent electronic device to the phasor data associated with a neighboring intelligent electronic device; and
    detecting a location of a broken conductor condition based on a difference between the phasor data of the first intelligent electronic device and the phasor data of the neighboring intelligent electronic device exceeding a threshold;
    wherein the phasor data comprises a rate of change of voltage and the threshold is exceeded when a rate of change of voltage of the first intelligent electronic device and a rate of change of voltage of the neighboring intelligent electronic device have opposite polarities.

12. The method of claim 11, further comprising:
    sending a command to disconnect a section of the conductor at the location of the broken conductor.

13. A non-transitory computer-readable medium having instructions that, when executed by a processor, cause the processor to perform operations for detecting a broken conductor on an electric power delivery system, the operations comprising:
    obtaining, via intelligent electronic devices, electric measurements from the electric power delivery system;
    determining phasor data for each of the intelligent electronic devices based on the data obtained by each of the intelligent electronic devices, wherein the phasor data comprises a rate of change of voltage;
    comparing the rate of change of voltage associated with a first intelligent electronic device to the rate of change of voltage associated with a neighboring intelligent electronic device;
    detecting a location of a broken conductor condition when the rate of change of voltage associated with the first intelligent electronic device and the rate of change of voltage associated with the neighboring intelligent electronic device have opposite polarities; and
    sending a command to disconnect a section of the conductor proximate the location of the broken conductor.

14. A system for detecting a broken conductor, comprising:
    a plurality of circuit breakers in electrical communication with a conductor, wherein each circuit breaker is configured to open and close an electrical path of the conductor;
    a plurality of intelligent electronic devices in communication with the plurality of circuit breakers and the conductor, such that each circuit breaker is in communication with at least one intelligent electronic device, wherein each intelligent electronic device is configured to obtain electrical measurements from the conductor, determine phasor data from the measurements, and transmit the phasor data; and
    a central controller device in communication with the plurality of intelligent electronic devices configured to receive the phasor data from the plurality of intelligent electronic devices and use the received phasor data to detect a broken conductor condition of the conductor by comparing a zero-sequence voltage magnitude from the phasor data of each of the plurality of intelligent electronic devices.

15. The system of claim 14, wherein the central controller device is configured to send a command that causes at least one of the plurality of circuit breakers to disconnect a section of the conductor proximate the location of the broken conductor.

16. The system of claim 15, wherein the central controller device is configured to detect which of three phases in an electrical distribution system is experiencing the broken conductor and send a command to open only the phase detected to have the broken conductor.

17. A computer implemented method for detecting a broken conductor on an electric power delivery system, comprising:
    obtaining electric measurements from the electric power delivery system using intelligent electronic devices in communication with the electric power delivery system;
    determining phasor data from the measurements;
    comparing the phasor data associated with a first intelligent electronic device to the phasor data associated with a neighboring intelligent electronic device; and
    detecting a location of a broken conductor condition based on a difference between the phasor data of the first intelligent electronic device and the phasor data of the neighboring intelligent electronic device exceeding a threshold
    wherein the phasor data comprises a rate of change of zero-sequence voltage and the threshold is exceeded when a rate of change of zero-sequence voltage of the first intelligent electronic device exceeds a predetermined threshold for a predetermined time and a rate of change of the zero-sequence voltage on the neighboring intelligent electronic devices does not exceed the predetermined threshold for the predetermined time.

18. A non-transitory computer-readable medium having instructions that, when executed by a processor, cause the processor to perform operations for detecting a broken conductor on an electric power delivery system, the operations comprising:
    obtaining, via intelligent electronic devices, electric measurements from the electric power delivery system;
    determining phasor data for each of the intelligent electronic devices based on the data obtained by each of the intelligent electronic devices, wherein the phasor data comprises a rate of change of zero-sequence voltage;
    comparing the rate of change of zero-sequence voltage associated with a first intelligent electronic device to the rate of change of zero-sequence voltage associated with a neighboring intelligent electronic device;
    detecting a location of a broken conductor condition when the rate of change of zero-sequence voltage associated with the first intelligent electronic device exceeds a predetermined threshold for a predetermined time, and the rate of change of zero-sequence voltage associated with the neighboring intelligent electronic device does not exceed the predetermined threshold; and sending a command to disconnect a section of the conductor proximate the location of the broken conductor.

* * * * *